(12) United States Patent
Lee

(10) Patent No.: US 8,139,146 B2
(45) Date of Patent: Mar. 20, 2012

(54) CAMERA MODULE, METHOD OF FOCUSING THE SAME, AND DEVICE FOR FOCUSING THE SAME

(75) Inventor: Sang Yeun Lee, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 289 days.

(21) Appl. No.: 12/654,684

(22) Filed: Dec. 29, 2009

(65) Prior Publication Data

US 2011/0063493 A1    Mar. 17, 2011

(30) Foreign Application Priority Data

Sep. 14, 2009    (KR) .................... 10-2009-0086587

(51) Int. Cl.
*H04N 5/225* (2006.01)
(52) U.S. Cl. ...................................... 348/373; 348/345
(58) Field of Classification Search .............. 348/345, 348/373; 438/64, 69, 65, 55
See application file for complete search history.

(56) References Cited

U.S. PATENT DOCUMENTS

| | | | |
|---|---|---|---|
| 6,067,025 A * | 5/2000 | Chiu et al. ............... | 340/686.5 |
| 6,541,284 B2 * | 4/2003 | Lam ........................ | 438/7 |
| 7,061,697 B2 * | 6/2006 | Magni et al. ............. | 359/811 |
| 2002/0006687 A1 * | 1/2002 | Lam ........................ | 438/118 |
| 2007/0008631 A1 * | 1/2007 | Webster et al. ........... | 359/819 |
| 2007/0077051 A1 * | 4/2007 | Toor et al. ............... | 396/144 |
| 2011/0013901 A1 * | 1/2011 | Utsugi ...................... | 396/529 |

FOREIGN PATENT DOCUMENTS

| | | |
|---|---|---|
| KR | 10-2006-0096269 | 9/2006 |
| KR | 10-2006-0106258 | 10/2006 |
| KR | 10-2009-0051902 | 5/2009 |

* cited by examiner

*Primary Examiner* — Jason Chan
*Assistant Examiner* — Gary C Vieaux

(57) ABSTRACT

An a camera module includes: a lens barrel housing lenses; a housing formed integrally with the lens barrel; and a substrate unit having a top surface bonded to the housing with an adhesive and including pass portions through which an ascending and descending unit passes, the ascending and descending unit vertically moving the housing to perform focusing when the housing is bonded to the substrate unit.

11 Claims, 5 Drawing Sheets

CAMERA MODULE, METHOD OF FOCUSING THE SAME, AND DEVICE FOR FOCUSING THE SAME

CROSS-REFERENCE TO RELATED APPLICATIONS

This application claims the priority of Korean Patent Application No. 10-2009-0086587 filed on Sep. 14, 2009, in the Korean Intellectual Property Office, the disclosure of which is incorporated herein by reference.

BACKGROUND OF THE INVENTION

1. Field of the Invention

The present invention relates to a camera module, and more particularly, to a camera module which is mounted on a personal mobile terminal or the like to perform an imaging function, a method of focusing the same, and a device for focusing the same.

2. Description of the Related Art

With the recent development of mobile terminals such as portable phones and personal digital assistants (PDA), mobile terminals now not only provide a phone call function, but also are used as multi-convergence devices for music, movies, games and so on. The most representative of these multi-convergence devices is a camera module.

Furthermore, as mobile terminals have reduced in size and thickness, so too have camera modules mounted in the terminals have been also reduced in size and thickness.

In a case of a high-pixel camera module, when a lens barrel for housing lenses is assembled into a housing, the height of the housing is adjusted and may be lessened. Therefore, it is essential to perform focusing.

In the process of assembling the lens barrel and the housing, the lens barrel is coupled to the housing through a screw in order to focus the camera module. Therefore, a position at which the camera module is focused may be adjusted and changed by an operator when coupling the lens barrel to the housing through a screw.

In such a camera module, however, when the lens barrel is turned to perform the focusing, foreign objects may fall from the contact portion into the space between the lens barrel and the housing, thereby causing a screen failure. Furthermore, when the lens barrel and the housing are assembled, rotational torque should be adjusted. Therefore, techniques for solving such problems are currently in demanded.

SUMMARY OF THE INVENTION

An aspect of the present invention provides a camera module which may simplify an assembly process, a method of focusing the same, and a device for focusing the same.

According to an aspect of the present invention, there is provided a camera module including: a lens barrel housing lenses; a housing formed integrally with the lens barrel; and a substrate unit having a top surface bonded to the housing with an adhesive and including pass portions through which an ascending and descending unit passes, the ascending and descending unit vertically moving the housing to perform focusing when the housing is bonded to the substrate unit.

Each of the pass portions may be a hole formed at the bonding portion between the housing and the substrate unit.

The pass portions may be formed in the respective corners of the substrate unit so as to be opened.

The lens barrel and the housing may be an integrated injection-molded product.

The housing may include an escape portion formed on an outer side surface of the housing bonded to the substrate unit and formed in a tapered shape to provide an escape space such that an adhesive escapes into the escape space.

According to another aspect of the present invention, there is provided a method of focusing a camera module including: disposing a housing over a substrate unit such that the housing is positioned at a bonding position with the substrate unit, the housing formed integrally with a lens barrel including a lens; applying an adhesive onto the bonding position of the substrate unit, and provisionally bonding the housing; and focusing the camera module by vertically moving the position of the housing an ascending and descending unit which passes through pass portions formed in the substrate unit.

After the lens is disposed in a mold, injection molding may be performed to form the housing such that the lens is housed in the housing.

The pass portions may be holes formed at the bonding portion between the housing and the substrate unit so as to pass through the substrate unit.

The pass portions may be formed by cutting the respective corners of the substrate unit.

According to another aspect of the present invention, there is provided a device for focusing a camera module including: an ascending and descending unit formed to pass through pass portions formed in a substrate unit; and a driving unit moving the ascending and descending unit to vertically move a housing integrated with a lens barrel, in order to focus the camera module.

The driving unit may include a motor unit formed at an end of the ascending and descending unit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
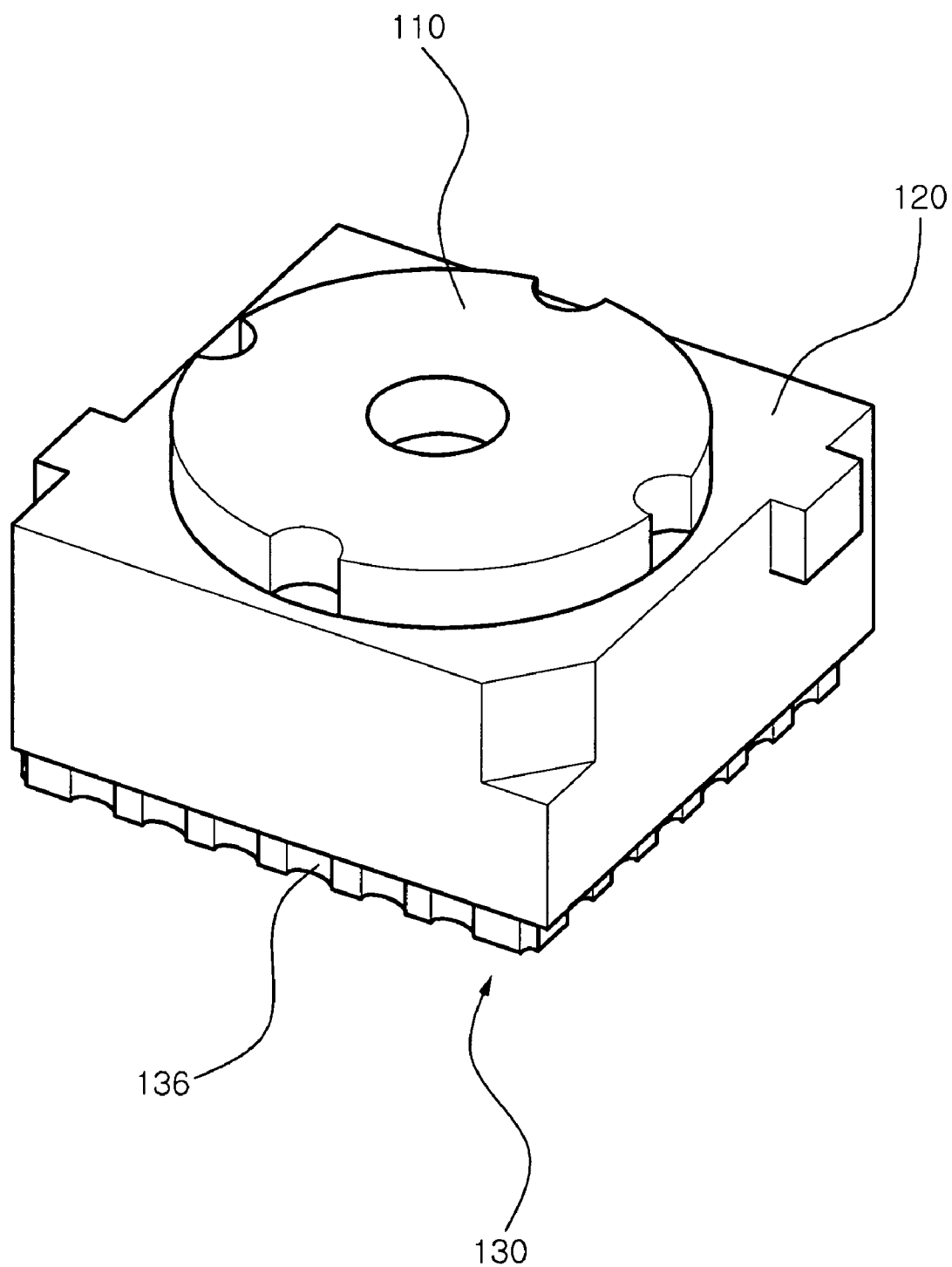
FIG. 1 is a perspective view of a camera module according to an embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

Figure 2:
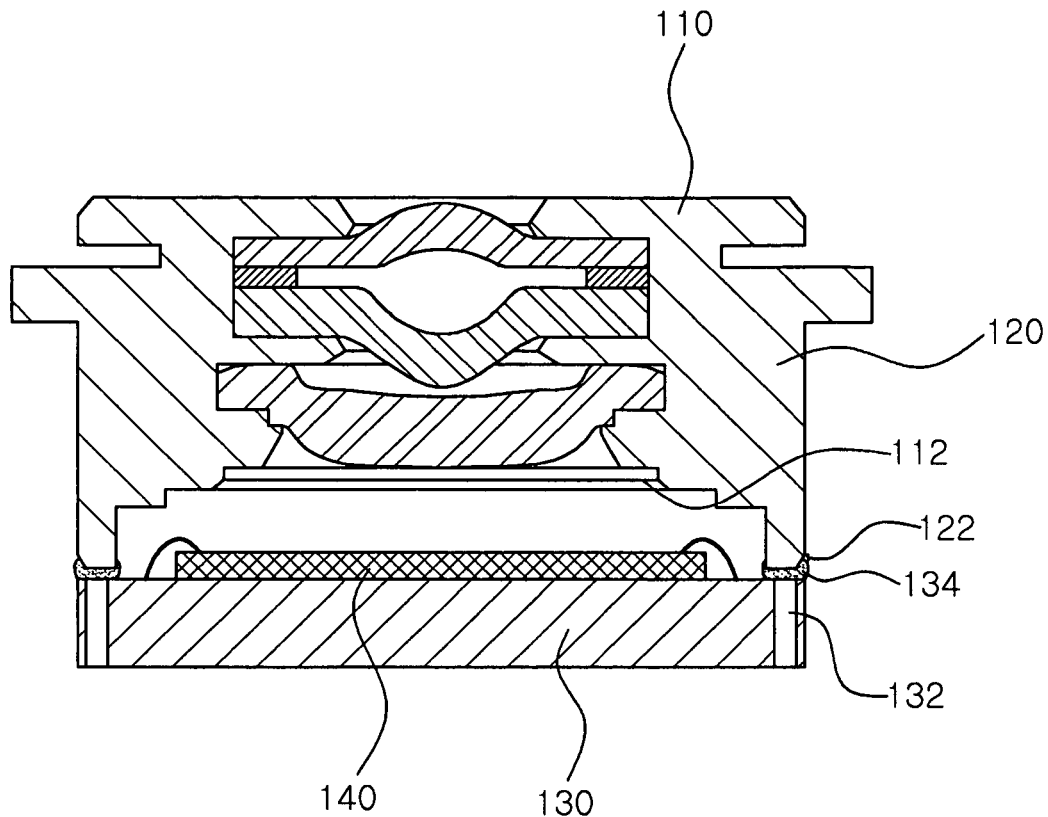
FIG. 2 is a cross-sectional view explaining a substrate unit of the camera module of FIG. 1.

FIG. 1 is a perspective view of a camera module according to an embodiment of the present invention. FIG. 2 is a cross-sectional view explaining a substrate unit of the camera module of FIG. 1.

Referring to FIGS. 1 and 2, the camera module 100 may include a lens barrel 110, a housing 120, and a substrate unit 130.

The lens barrel 110 is an injection-molded product integrated with the housing 120. A plurality of lenses are housed in the lens barrel 110 so as to be arranged along an optical axis. Therefore, the housing 120 integrated with the lens barrel 110 may be manufactured by injecting an injection molding material into a mold in which the lenses are arranged in designed positions.

In this case, although not shown, the lenses 110 arranged in the lens barrel 110 may include at least one space such that the adjacent lenses may be spaced a predetermined distance from each other. While at least one lens is disposed within the lens barrel 110, the number of lenses disposed in the lens barrel 110 is not limited.

As described above, the housing 120 is formed integrally with the lens barrel 110 through one injection molding process. The boundary between the lens barrel 110 and the housing 120 is not substantially defined.

The housing 120 may include an infrared (IR) filter 112 bonded to the inside thereof, the IR filter 112 capable of filtering infrared rays from light passing through the lenses. The bottom surface of the housing 120 may be bonded to the top surface of the substrate unit 130 with an adhesive 134.

An escape portion 122 may be formed at an outer side of the bonded surface of the housing 120 bonded to the substrate unit 130. The escape portion 122 may be formed in a tapered shape to provide an escape space such that the adhesive 134 escapes into the escape space. When the substrate unit 130 and the housing 120 are pressurized and bonded to each other, the pressurizing force causes the adhesive 134 to flow into the escape 122 of the housing 120. Therefore, it is possible to prevent the adhesive 134 from moving to the outside of the substrate unit 130.

In this embodiment of the present invention, the escape portion 122 prevents the adhesive 134 from moving to a side electrode unit 136 formed on each side surface of the substrate unit 130 such that the side electrode unit 136 is not contaminated by the adhesive 134.

The IR filter 112 is positioned between the lens barrel 110 and an image sensor 140, and may be bonded to a support surface formed inside the housing 120 with an adhesive.

An IR filter capable of filtering infrared rays from transmitted light may be used as the IR filter 112. Without being limited thereto, however, the IR filter 112 may be substituted with any filter capable of filtering unnecessary light from light transmitting the lenses.

The image sensor 140 is positioned under the lens barrel 110, and may convert an image formed by the lens barrel 110 into an electrical signal. In order for the conversion, the image sensor 140 may include a pixel array and a photoelectric conversion unit.

The pixel array stores electric charges in response to light transmitting the lenses, and the photoelectric conversion unit serving a light receiving element converts the electric charges stored in the pixel array into electric signals which can be used. For example, a charge-coupled device (CCD) image sensor or complementary metal oxide semiconductor (CMOS) image sensor may be used as the image sensor 140.

The image sensor 140 may be mounted on the top surface of the substrate unit 130 by a wire bonding method. The electrical connection between the substrate unit 130 and the image sensor 140 is not limited to the wire bonding method.

Figure 3:
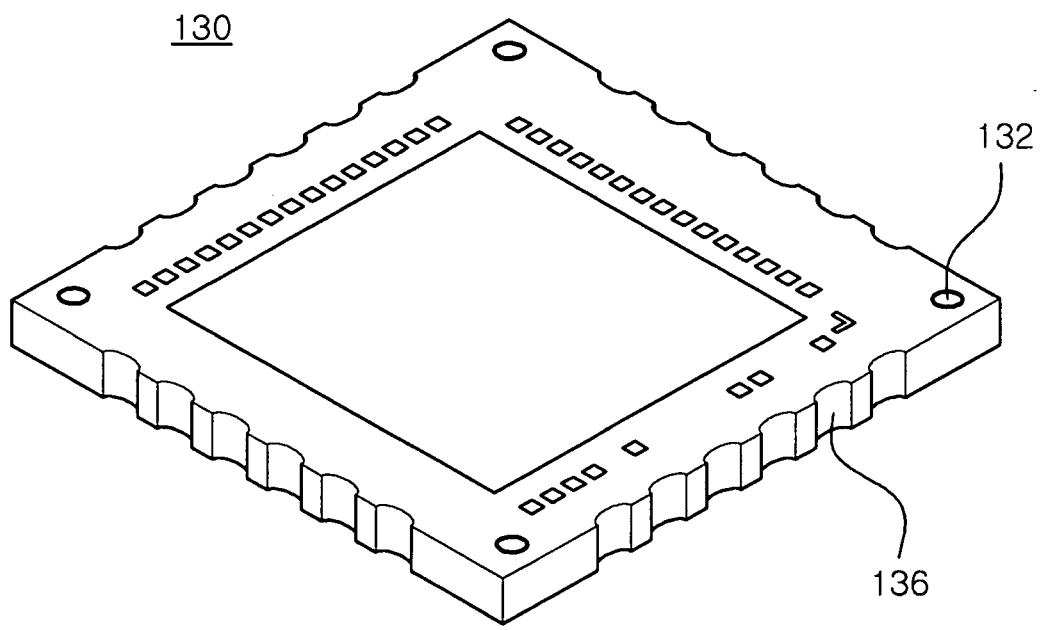
FIG. 3 is a perspective view of the substrate unit of the camera module according to the embodiment of the present invention.

FIG. 3 is a perspective view explaining the substrate unit of the camera module according to the embodiment of the present invention.

Referring to FIG. 3, the substrate 130 is bonded to the bottom surface of the housing 120 such that the image sensor 140 mounted on the top surface of the substrate 130 is disposed inside the internal space of the housing 120.

The substrate 130 may include a pad unit formed on the surface thereof, the pad unit being positioned around the image sensor 140. Therefore, wire bonding may be performed in such a manner that the image sensor 140 may be electrically connected to the pad unit.

Furthermore, the substrate 130 may include a pass portion 132 formed in each of four corners thereof, through which an ascending and descending unit 10 passes. The ascending and descending unit 10 vertically moves the housing 120 in order to focus the camera module.

The pass portion 132 is formed at the bonding portion between the housing 120 and the substrate 130, and may be a hole passing through the substrate 130. However, the pass portion 132 is not limited thereto. The shape of the pass portion 132 may be designed in various manners depending on the intention of a designer.

Figure 4:
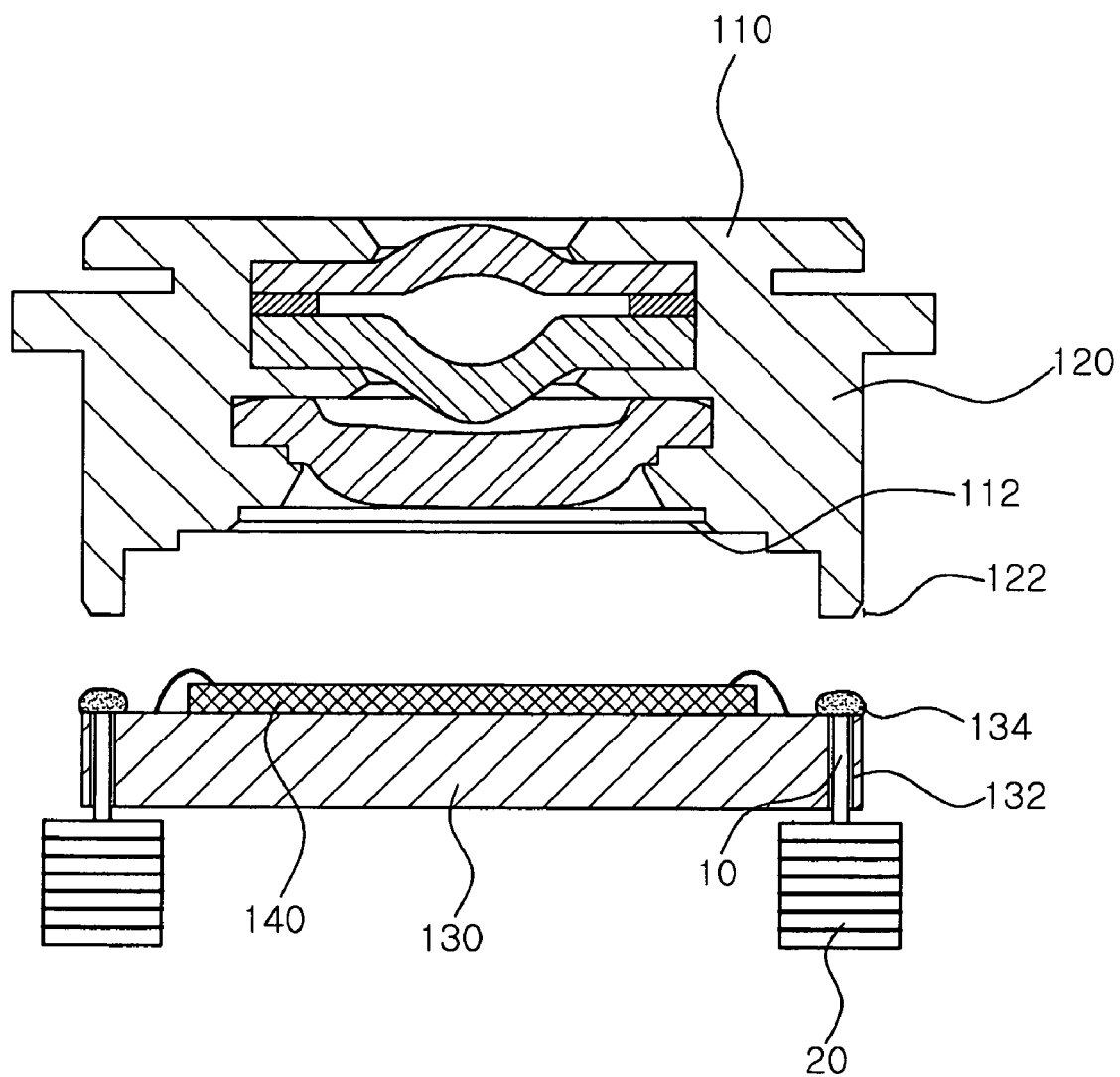
FIGS. 4 to 6 are cross-sectional views explaining a method of focusing a camera module according to another embodiment of the present invention.
Figure 5:
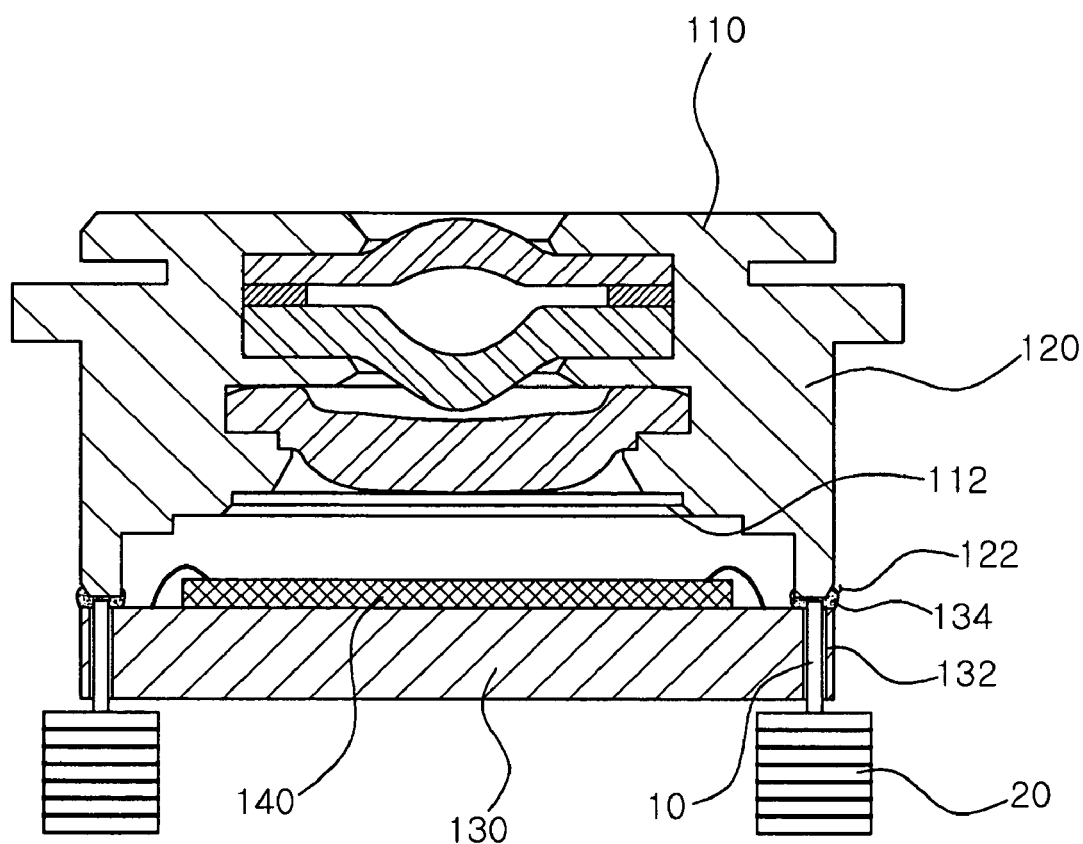
Figure 6:
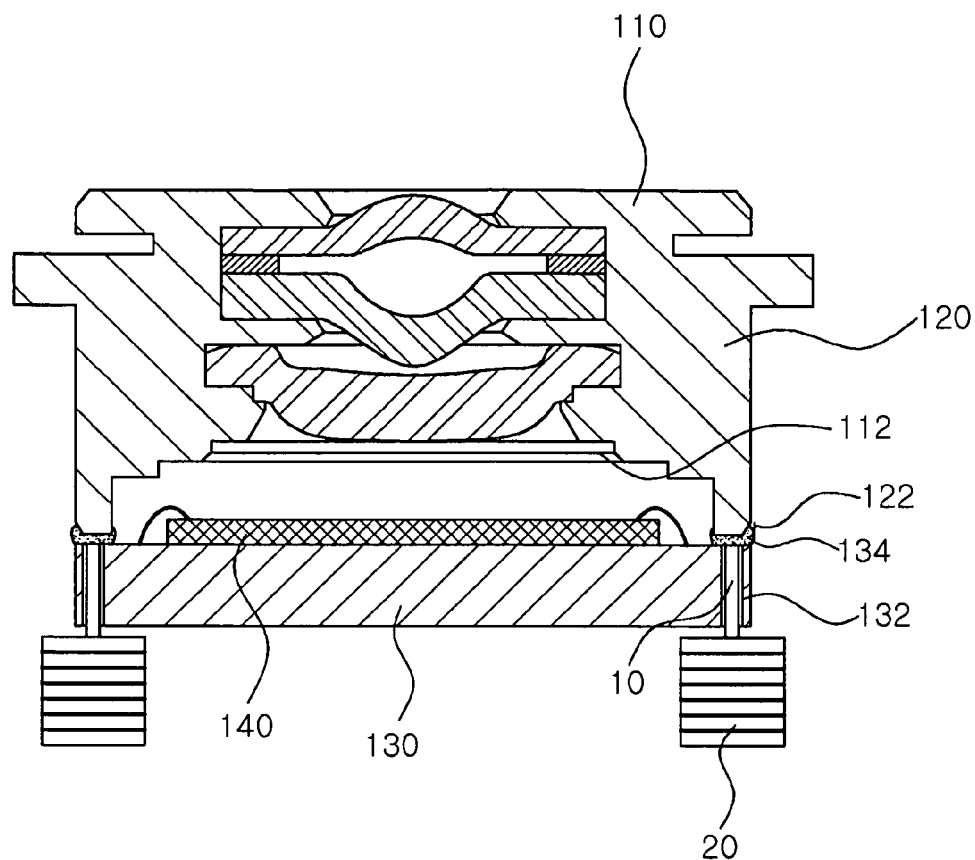

FIGS. 4 to 6 are cross-sectional views explaining a method of focusing a camera module according to another embodiment of the present invention.

Referring to FIG. 4, the method of focusing a camera module may include disposing the housing 120 integrated with the lens barrel 110 over the substrate 130 such that the housing 120 is positioned at a bonding position with the substrate unit 130.

At this time, an adhesive 134 is applied onto the top surface of the substrate 130 so as to correspond to the bonding position with the housing 120. In the application position of the adhesive 134, the pass portions 132 of the substrate unit 130 are formed.

The ascending and descending unit 10 is positioned under the substrate unit 130, and inserted into the pass portions 132 formed in the substrate unit 130.

Referring to FIG. 5, the method may include provisionally bonding the housing 120 after applying the adhesive 134 onto the bonding position of the substrate 130.

The ascending and descending unit 10 passes through the pass portions 132 to adjust the height of the housing 120. While the adhesive 134 hardens, the height of the housing 120 may be adjusted.

Referring to FIG. 6, as the height of the housing 120 is adjusted, the focusing of the camera module is performed. The position of the camera module is adjusted using the ascending and descending unit 10. After the position is adjusted, the adhesive 134 hardens so that the housing 120 is fixed in position.

A device for focusing the camera module according to another embodiment of the present invention may includes the ascending and descending unit 10 and a driving unit.

The ascending and descending unit 10 may be formed to pass through the pass portions 132 formed in the substrate unit 130. The shape of the ascending and descending unit 10 is not limited as long as the ascending and descending unit 10 has a size smaller than the diameter of the pass portions 132. For example, the lifting and lower unit 10 may be formed in a bar shape.

The driving unit for vertically moving the ascending and descending unit 10 may include a motor unit 20. The ascending and descending unit 10 may be minutely moved by a driving force provided from the motor unit 20. The driving unit is not limited to the motor unit 20.

In general, a lens barrel and a housing are separately formed and coupled to each other through a screw to form a camera module. In this case, when focusing is performed by turning the lens barrel, foreign objects may fall from the contact portion into the space between the lens barrel and the housing, thereby causing a screen failure. When the lens barrel and the housing are assembled to each other, it is difficult to adjust a rotational torque.

However, in the camera module, the method of focusing the same, and the device for focusing the same according to the embodiments of the present invention, since the lens barrel 110 and the housing 120 are integrally formed, the above-described assembly process may be omitted. Accordingly, it is possible to prevent foreign objects from occurring and remove such difficulties in adjusting a rotational torque.

Furthermore, since the focusing of the camera module is simply performed by the device for focusing the camera module, the embodiments of the present invention may be easily applied to a high-pixel camera module which necessarily performs focusing.

Figure 7:
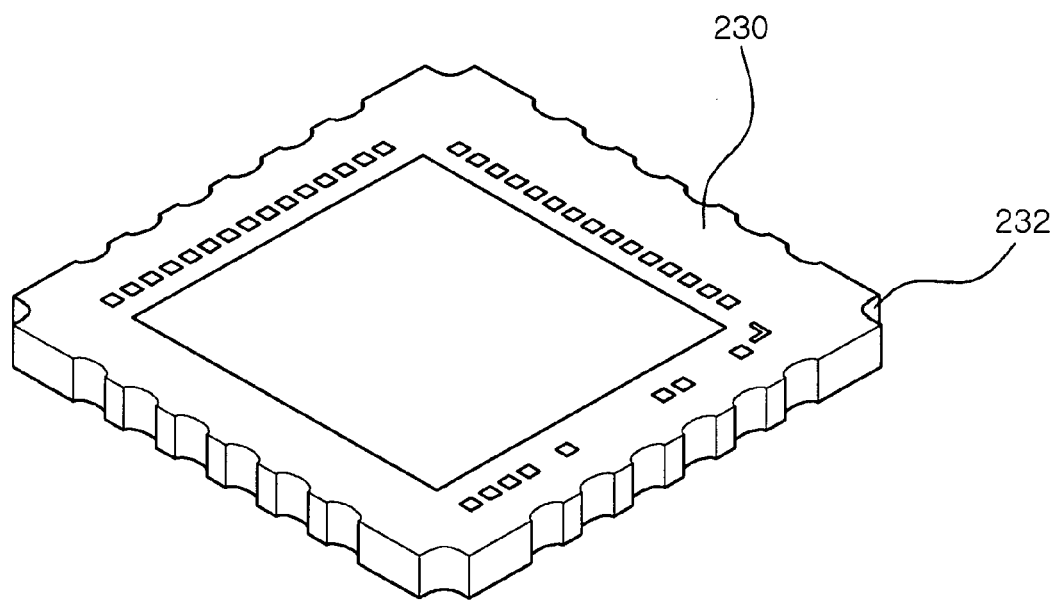
FIG. 7 is a perspective view explaining a substrate unit of a camera module according to another embodiment of the present invention.

FIG. 7 is a perspective view explaining a substrate unit of a camera module according to another embodiment of the present invention. The housing 120, the image sensor 140, and the ascending and descending unit 10 are substantially the same as those of the above-described embodiment. Therefore, specific description thereof will be omitted.

Referring to FIG. 7, a substrate unit 230 is bonded to the bottom surface of the housing 120 such that the image sensor 140 mounted on the top surface of the substrate unit 230 is disposed in the internal space of the housing 120.

The substrate unit 230 may include a pad unit positioned around the image sensor 140 on the surface thereof. The image sensor 140 may be electrically connected to the pad unit through wire bonding.

The substrate unit 230 may include a pass portion formed in each of the four corners thereof. The pass portion may be an open portion 232 formed in each of the corners of the substrate unit 230.

The ascending and descending unit 10 for vertically moving the housing 120 vertically moves through the open portions 232, in order to focus the camera module. The open portions 232 of the substrate unit 230 may be formed more easily than the pass portions 132 of the substrate unit 130 according to the above-described embodiment of the present invention.

While the present invention has been shown and described in connection with the exemplary embodiments, it will be apparent to those skilled in the art that modifications and variations can be made without departing from the spirit and scope of the invention as defined by the appended claims.

What is claimed is:

1. A camera module comprising:
    a lens barrel housing lenses;
    a housing formed integrally with the lens barrel; and
    a substrate unit having a top surface bonded to the housing with an adhesive and comprising pass portions through which an ascending and descending unit passes, the ascending and descending unit vertically moving the housing to perform focusing when the housing is bonded to the substrate unit.

2. The camera module of claim 1, wherein each of the pass portions is a hole formed at the bonding portion between the housing and the substrate unit.

3. The camera module of claim 1, wherein the pass portions are formed in the respective corners of the substrate unit so as to be opened.

4. The camera module of claim 1, wherein the lens barrel and the housing are an integrated injection-molded product.

5. The camera module of claim 1, wherein the housing comprises an escape portion formed on an outer side surface of the housing bonded to the substrate unit and formed in a tapered shape to provide an escape space such that the adhesive escapes into the escape space.

6. A method of focusing a camera module, comprising:
    disposing a housing over a substrate unit such that the housing is positioned at a bonding position with the substrate unit, the housing formed integrally with a lens barrel comprising a lens;
    applying an adhesive onto the bonding position of the substrate unit, and provisionally bonding the housing; and
    focusing the camera module by vertically moving the position of the housing an ascending and descending unit which passes through pass portions formed in the substrate unit.

7. The method of claim 6, wherein after the lens is disposed in a mold, injection molding is performed to form the housing such that the lens is housed in the housing.

8. The method of claim 6, wherein the pass portions are holes formed at the bonding portion between the housing and the substrate unit so as to pass through the substrate unit.

9. The method of claim 6, wherein the pass portions are formed by cutting the respective corners of the substrate unit.

10. A device for focusing a camera module having a lens barrel housing lenses, a housing formed integrally with the lens barrel, and a substrate unit having a top surface bonded to the housing with an adhesive and comprising pass portions through which an ascending and descending unit passes, the ascending and descending unit vertically moving the housing to perform focusing when the housing is bonded to the substrate unit, comprising:
    the ascending and descending unit formed to pass through the pass portions formed in the substrate unit; and
    a driving unit moving the ascending and descending unit to vertically move the housing integrated with the lens barrel, in order to focus the camera module.

11. The device of claim 10, wherein the driving unit comprises a motor unit formed at an end of the ascending and descending unit.

* * * * *

UNITED STATES PATENT AND TRADEMARK OFFICE
CERTIFICATE OF CORRECTION

| | |
|---|---|
| PATENT NO. | : 8,139,146 B2 |
| APPLICATION NO. | : 12/654684 |
| DATED | : March 20, 2012 |
| INVENTOR(S) | : Sang Yeun Lee |

Page 1 of 1

It is certified that error appears in the above-identified patent and that said Letters Patent is hereby corrected as shown below:

Column 6, Line 29, In Claim 6, delete "housing an" and insert -- housing using an --, therefor.

Signed and Sealed this
Fourth Day of September, 2012

David J. Kappos
*Director of the United States Patent and Trademark Office*